United States Patent
Ota et al.

(10) Patent No.: US 6,861,359 B2
(45) Date of Patent: Mar. 1, 2005

(54) PROCESS FOR SEMICONDUCTOR APPARATUS INCLUDING FORMING AN INSULATOR AND A SEMICONDUCTOR FILM ON THE BACKSIDE OF THE WAFER AND REMOVING THE SEMICONDUCTOR FILM FROM THE BACKSIDE

(75) Inventors: Katsuhiro Ota, Yokohama (JP); Noriyo Tomiyama, Hidaka (JP); Teruhisa Ichise, Hachioji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/441,044

(22) Filed: May 20, 2003

(65) Prior Publication Data

US 2004/0026692 A1 Feb. 12, 2004

(30) Foreign Application Priority Data

May 20, 2002 (JP) ........................................ 2002-143994
Apr. 9, 2003 (JP) ........................................ 2003-105376

(51) Int. Cl.⁷ ........................ H01L 21/302; H01L 21/461
(52) U.S. Cl. ........................ 438/692; 438/716; 438/748; 438/753
(58) Field of Search ........................ 438/692, 716, 438/748, 753

(56) References Cited

U.S. PATENT DOCUMENTS 5,426,073 A * 6/1995 Imaoka et al. ............... 438/597
6,562,692 B1 * 5/2003 Oi ................................ 438/406

FOREIGN PATENT DOCUMENTS

JP  Hei 5-21742   1/1993
JP  Hei-11-88590  7/1999

OTHER PUBLICATIONS

Werner Kern, "Handbook of Semiconductor Wafer Cleaning Technology," Science Technology and Applications, 1993, Werner Kern, pp 516–517.

* cited by examiner

*Primary Examiner*—William M. Brewster
(74) *Attorney, Agent, or Firm*—Antonelli, Terry, Stout & Kraus, LLP

(57) ABSTRACT

In order to prevent dusting from a peripheral end portion of a wafer, a semiconductor film formed is removed from at least the entire surface of the backside of the wafer and from the peripheral portion of the wafer by etching at a high etching rate relative to an insulating film present beneath the semiconductor film, to realize a semiconductor apparatus in which the semiconductor film is formed in an integrated circuit pattern region on the face side of the wafer.

Thus, the problem of dusting from the peripheral portion of the wafer is obviated, and a semiconductor apparatus with high reliability is realized.

21 Claims, 10 Drawing Sheets

PROCESS FOR SEMICONDUCTOR APPARATUS INCLUDING FORMING AN INSULATOR AND A SEMICONDUCTOR FILM ON THE BACKSIDE OF THE WAFER AND REMOVING THE SEMICONDUCTOR FILM FROM THE BACKSIDE

BACKGROUND OF THE INVENTION

The present invention relates to a cleaning method (hereinafter, ordinary cleaning methods, surface treatment methods and the like will be generically referred to as a cleaning method) applicable to many electronic parts such as electronic materials, magnetic materials, optical materials, ceramics, etc. and the production process of the electronic parts. In particular, the present invention relates to a method of producing a semiconductor apparatus by use of a preferable cleaning method and to a semiconductor apparatus produced by the method.

The structure of a general semiconductor apparatus is such that, as described in patent document 1, a thermal oxide film is provided on a Si substrate, or an insulating film is formed on the Si substrate by use of CVD (Chemical vapor Deposition) or PVD (Physical vapor Deposition), a semiconductor film is further provided thereon, and these films are processed to form semiconductor devices. Therefore, at the time of forming the semiconductor devices by processing the films, the film in the subsequent step is formed in such a manner as to cover a peripheral end portion of the underlying substrate or an underlying film, so that when the covering is insufficient, the film of this portion constitutes a source of dust, which would hamper the production of the semiconductor apparatus.

A general cleaning method for a semiconductor substrate (silicon wafer) is a method in which the substrate (wafer) is cleaned by immersing it in a cleaning liquid such as diluted hydrofluoric acid, a mixed liquid of ammonia and aqueous hydrogen peroxide, etc. for a predetermined period of time. Incidentally, a mixed liquid of ammonia, aqueous hydrogen peroxide and ultra-pure water is described, for example, in "Handbook of Semiconductor Wafer Cleaning Technology", written by Wern Kern, published by Noyes Publications (1995), p. 517.

In addition, as a method of removing the contamination source present at a peripheral end portion of a wafer, there is known a method in which the steps of photoresist application, patterning, dry etching and photoresist removal are repeated, as described in Japanese Patent Laid-open No. Hei 5-21724, and a method in which the peripheral end portion of the wafer is mechanically polished, as described in Japanese Patent Laid-open No. Hei 11-188590.

SUMMARY OF THE INVENTION

In recent years, in order to contrive high-integration of semiconductor integrated circuits, miniaturization and multi-layering have been progressing more and more. In this instance, when a semiconductor film is formed on a semiconductor substrate and contact holes and patterns are formed by employing a dry etching method, the peripheral end portion of a wafer is damaged to form a source of generation of chippings or particles. In particular, in the case of a multi-layered structure comprising semiconductor films, when the formation of contact holes and patterns is conducted for each semiconductor film, the damage to the peripheral end of the wafer is increased each time of the formation, so that chippings or particles are liable to be generated.

In general, examples of a method of removing the chippings or particles include batch-type cleaning and single wafer-type cleaning. However, in the batch-type cleaning, a multiplicity of wafers are cleaned simultaneously, and the wafers become contamination sources, which may re-contaminate other wafers. On the other hand, in the conventional rotation-type single wafer-type cleaning, the wafers are cleaned while being rotated, so that contaminants scattered in the single wafer-type cleaning apparatus may bounce around to re-contaminate the wafers. Further, the scattered contaminants would contaminate the inside of the single wafer-type cleaning apparatus, whereby the wafers subsequently introduced into the cleaning apparatus would be contaminated.

Furthermore, similar contamination will continuously occur in the subsequent cleaning step unless the dusting sources such as the chippings and particles present at the peripheral end portion of the wafer are completely removed.

Besides, even where photoresist application, patterning, dry etching and photoresist removal are repeated so as to remove the contamination sources from the peripheral portion of the wafer or where the peripheral portion of the wafer is mechanically polished, a portion of no dry-etched would be generated because the peripheral end portion of the wafer is in the shape of a curved line as viewed sideways. In the case of the mechanical polishing method, also, a portion that cannot be polished would be generated. In addition, the polishing liquid that has been used for polishing and polish debris must be removed after the polishing, so that an additional process is needed. Besides, since the side surfaces of various films are exposed after the polishing, where a cleaning step is subsequently conducted and there is a difference in the rate of etching of the various films by the cleaning liquid, the films at the peripheral portion of the wafer are formed into the shape of eaves, to constitute a source of dusting. Further, the backside of the wafer is not subjected to dry etching or polishing, the contamination sources present on the back backside side of the wafer cannot be removed.

The present invention has been made in consideration of the above-mentioned problems in the prior art. Accordingly, it is an object of the present invention to provide a semiconductor device and a process for its production by which it is possible to solve the problem of dusting from the peripheral portion (inclusive of the peripheral end portion) and the backside of a semiconductor substrate (wafer) and to easily decrease the dusting.

In order to attain the above object, according to the present invention, there is provided a semiconductor apparatus comprising a semiconductor substrate, an insulating film provided on the entire surface of the backside of the semiconductor substrate and on a peripheral portion inclusive of a peripheral end portion of the semiconductor substrate, and a semiconductor film provided on a face side region exclusive of a peripheral portion of the insulating film. The insulating film is a silicon-containing inorganic material film comprised of a $Si_3N_4$ film or a $SiO_2$ film or an organic material film, the $SiO_2$ film is PSG (Phospho Silicate Glass) or SOG (Spin On Glass), and the organic material film is a low dielectric constant insulating film.

Specific examples of the organic material film include a fluorine-added $SiO_2$ film, organic polymers, fluoro resins, polyimide-based resins, BCB (Benzocyclo butene), hydrogen-containing SOG (Hydrogen Silsequioxane: HSQ-SOG), and organic SOG films. Examples of the semiconductor film include polycrystalline or single crystal silicon films, silicon-containing inorganic material films ($Si_3N_4$ film, $SiO_2$ film, etc.), and organic material films (fluorine-added $SiO_2$ film, organic polymers, fluoro resin, polyimide-based resins, BCB, hydrogen-containing SOG, organic SOG films, etc.).

In addition, according to the present invention, there is provided a process for producing a semiconductor apparatus comprising a removing step in which a semiconductor film present on a peripheral portion inclusive of at least a peripheral end portion of a wafer and on an insulating film is removed by setting a ratio of etching rate relative to the insulating film to not less than 1:100 so that the semiconductor film is provided in a face side region exclusive of the peripheral portion of the wafer. In the removing step, where the semiconductor film is provided on the insulating film also on the backside of the wafer, this semiconductor film is simultaneously removed.

Specifically, the semiconductor film is removed by use of a chemical liquid (cleaning liquid) in such a manner that the ratio of etching rate ratio relative to the insulating film is not less than 1:100. The chemical liquid to be used is selected according to the material of the semiconductor film and the material of the insulating film.

(1) An acidic solution containing at least one of hydrofluoric acid, nitric acid, acetic acid, and organic acids;

(2) An acidic solution containing the just-mentioned acidic solution, aqueous hydrogen peroxide, and ammonium fluoride;

(3) A neutral solution represented by water.

More specifically, in the case where the insulating film is a silicon-containing organic material film or a silicon-containing inorganic material film ($SiO_2$), and the semiconductor film is polycrystalline or single crystal silicon:

(1) A mixed chemical liquid of hydrofluoric acid, nitric acid and water, in a ratio in terms of volume ratio of commercial chemical liquids of $HF:HNO_3:H_2O=0.1$ to 10:40 to 80:10 to 50, so prepared that the ratio of etching rate of the semiconductor film/insulating film by the mixed chemical liquid is not less than 100.

(2) A chemical liquid obtained by adding a surface active agent (concentration: $1\times10^{-4}$ to 1%) to the chemical liquid of (1) above.

(3) A chemical liquid obtained by adding acetic acid (concentration: $1\times10^{-4}$ to 1%) to the chemical liquid of (1) or (2) above.

(4) A mixed chemical liquid of ammonium fluoride, aqueous hydrogen peroxide and water in a ratio of ammonium fluoride (an aqueous solution containing 0.1 to 5% of $NH_4F$ and HF):aqueous hydrogen peroxide (aqueous 30% solution):water=0.1 to 5:0.5 to 15:1 to 15, so prepared that the ratio of etching rate of the semiconductor film/insulating film is not less than 100.

(5) A chemical liquid obtained by adding a surface active agent (concentration: $1\times10^{-4}$ to 1%) to the chemical liquid of (4) above.

(6) A chemical liquid obtained by adding acetic acid (concentration: $1\times10^{-4}$ to 1%) to the chemical liquid of (4) or (5) above.

B. In the case where the insulating film is a silicon-containing inorganic material film ($Si_3N_4$) and the semiconductor film is polycrystalline or single crystal silicon:

The chemical liquid of (1), (2), (3), (4), (5) or (6) above.

(7) A mixed aqueous solution of hydrofluoric acid and water, in a ratio in terms of volume ratio of commercial chemical liquids of hydrofluoric acid (aqueous 50% solution):$H_2O$=1:0 to 500, so prepared that the ratio of etching rate of the semiconductor film/insulating film by the mixed aqueous solution is not less than 100. For example, hydrofluoric acid (aqueous 50% solution):$H_2O$=1:0.

(8) A chemical liquid obtained by adding a surface active agent (concentration: $1\times10^{-4}$ to 1%) to the chemical liquid of (7) above.

(9) A chemical liquid obtained by adding acetic acid (concentration: $1\times10^{-4}$ to 1%) to the chemical liquid of (7) or (8) above.

C. In the case where the insulating film is a silicon-containing inorganic material film ($Si_3N_4$) and the semiconductor film is a silicon-containing inorganic material film:

The chemical liquid of (4), (5), (6), (7), (8) or (9) above.

Incidentally, in the wafer, the region on the insulating film where the semiconductor film is removed by the above-mentioned removing step must be exclusive of the integrated circuit pattern region of the surface where semiconductor devices are formed. That is, the region where the semiconductor film is removed by the etching cleaning is not limited as long as it does not exert a bad influence on the integrated circuit pattern region of the surface where the semiconductor devices are formed. In addition, as the cleaning apparatus for removing the semiconductor film by use of the above-mentioned chemical liquid, for example, Model RST100, a product by SEZ, can be used, as shown in FIG. 3.

According to the present invention, it is possible to prevent the semiconductor film formed on the peripheral portion (peripheral end portion: side walls) of the wafer from being exfoliated during the process of producing the semiconductor apparatus to become particles, and to effectively alleviate the lowering of the production yield of the semiconductor apparatus arising from the particles.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF PREFERRED EMBODIMENTS

Figure 1:
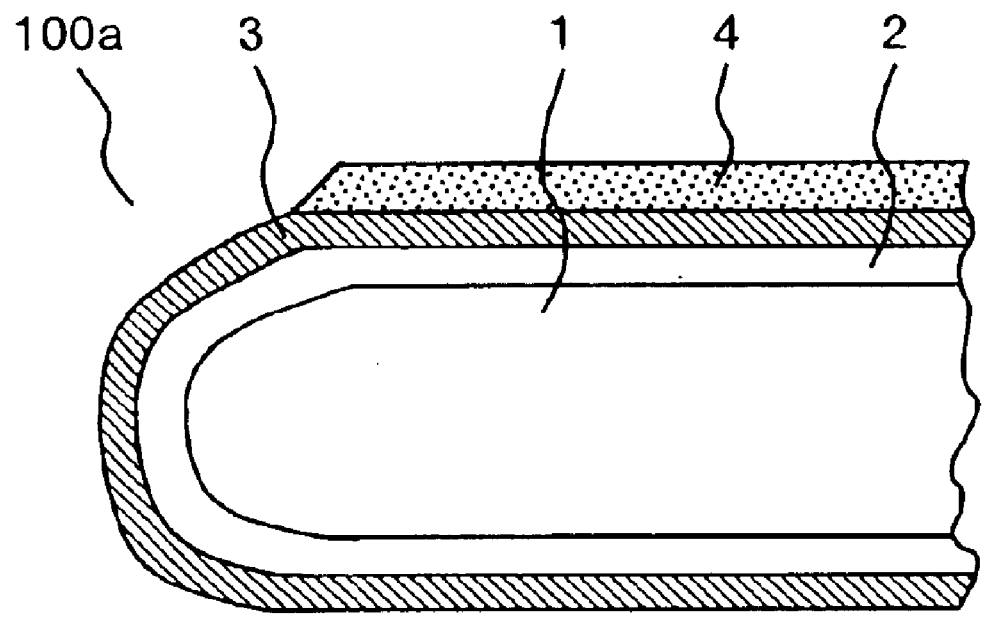
FIG. 1 shows a sectional peripheral portion of a semiconductor apparatus which is a basic concept of the present invention.

Now, embodiments of the present invention will be described in detail below, referring to the drawings.

First, the basic concept of the present invention will be described referring to FIGS. 1 to 5. FIG. 1 shows a sectional peripheral portion of a semiconductor apparatus which is the basic concept of the present invention. A semiconductor apparatus 100a in which a high-speed high-capacity semiconductor integrated circuit (for example, dynamic RAM) suitable for high-integration is formed according to the present invention comprises a semiconductor substrate (for example, Si substrate) 1, an insulating film 3 formed on a peripheral portion, inclusive of a peripheral end portion having a curved cross section, and the backside of the semiconductor substrate 1, and a semiconductor film 4 with semiconductor devices formed on the surface, exclusive of a peripheral portion, of the insulating film 3 on the semiconductor substrate 1. In FIG. 1, there is shown the case where an underlying film 2 is formed between the semiconductor substrate 1 and the insulating film 3. A semiconductor film or an insulating film is used as the underlying film 2.

Next, according to the basic concept shown in FIG. 1, a production process of the semiconductor apparatus according to the present invention will be described referring to FIGS. 2A to 2F.

Figure 2A:
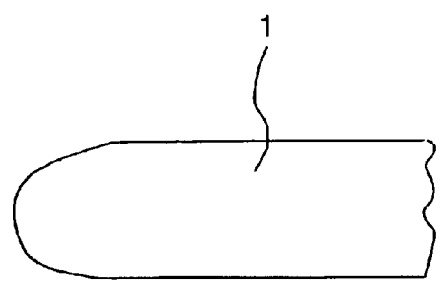
FIGS. 2A to 2F show production steps of the semiconductor apparatus according to the present invention.

First, the semiconductor substrate (for example, Si substrate) 1 with a peripheral end portion having a curved cross section as shown in FIG. 2A is provided with, for example, a P-type silicon epitaxial layer 19 grown as will be described-later, a plurality of N+ buried layers 18 are formed therebetween, and, further, an N well region 20 having such a depth as to reach the N+ buried layer 18 is formed in a desired region.

Figure 2D:
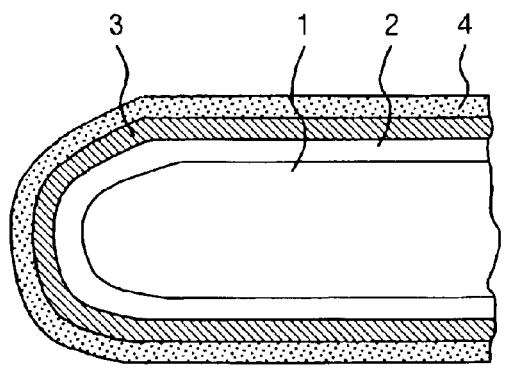
Figure 2B:
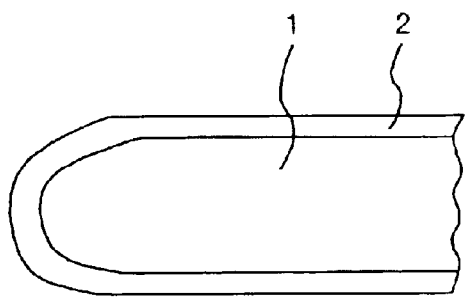

Subsequently, as shown in FIG. 2B, the underlying film (inclusive of a device isolation oxide film formed by thermal oxidation, for example) 2 consisting of an insulating film or a semiconductor film is formed on the entire surface (the face side, the peripheral end portion and the backside) of the semiconductor substrate 1 by, for example, a CVD method. Incidentally, the underlying film 2 may be consist of a multiplicity of laminated layers, and a circuit pattern or patterns may be present or absent on the face side.

Figure 2E:
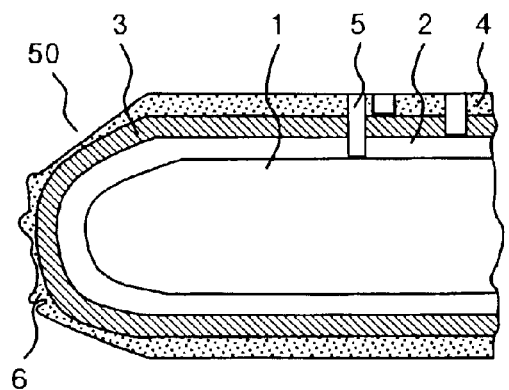
Figure 2C:
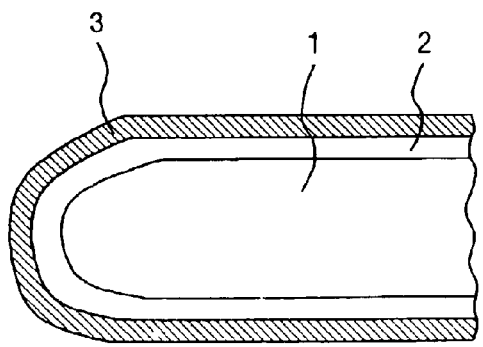

Next, as shown in FIG. 2C, the insulating film 3 composed of a silicon-containing inorganic material film consisting of a $Si_3N_4$ film or a $SiO_2$ film or an organic material film (for example, a low dielectric constant insulating film) is formed on the surface (the face side, the peripheral end portion and the backside) of the underlying film 2 by, for example, a CVD method. In this case, the insulating film 3 is formed also on the backside so that the underlying film 2 and the semiconductor substrate 1 will not undergo etching cleaning when etching cleaning by a chemical liquid (cleaning liquid) is conducted as will be described later. Naturally, it is unnecessary to form the insulating film 3 on the backside in the case where the underlying film 2 plays the role of the insulating film 3.

Subsequently, as shown in FIG. 2D, a semiconductor film (for example, polycrystalline or single crystal silicon film) 4 for forming semiconductor devices 5 is formed on the entire surface of the insulating film 3 by, for example, a CVD method or the like. In this case, when the film formation is conducted with the wafer spaced from the chuck surface, the semiconductor film 4 is formed also on the backside; on the other hand, when the film formation is conducted with the wafer in close contact with the chuck surface, the semiconductor film 4 is not formed on the backside.

Next, such steps as photoresist application, light exposure, dry etching and photoresist removal, or a CMP (Chemical Mechanical Polishing) step, which are commonly well known, are applied to the insulating film 3 or the semiconductor film 4, whereby a wafer 50 with semiconductor devices 5 such as capacitor device formed in the semiconductor film 4 on the surface of the semiconductor substrate 1 is obtained.

Figure 2F:
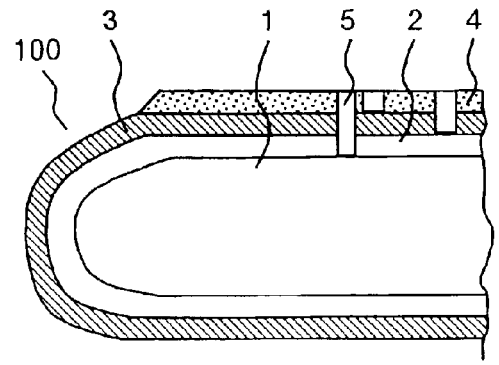
Figure 3:
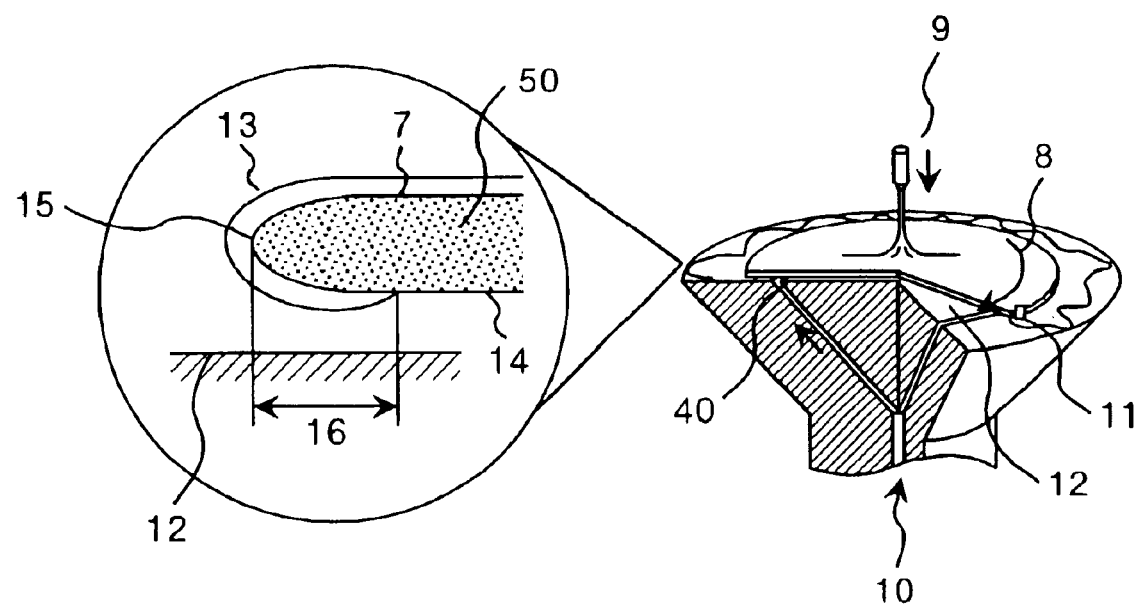
FIG. 3 is a schematic diagram showing one embodiment of a cleaning apparatus for use in the production process of the semiconductor apparatus according to the present invention.

In this instance, as shown in FIG. 2E, a damaged portion 6 of the semiconductor film 4 is seen at the peripheral end portion of the wafer 50, so that the damaged portion 6 is removed by use of a chemical liquid and a cleaning apparatus, for example, as shown in FIG. 3, whereby a semiconductor apparatus 100 according to the present invention is obtained. This is shown in FIG. 2F.

Here, the method of removing the damaged portion 6 by the chemical liquid is not particularly limited. For example, the wafer 50 is disposed with its face side up, and the wafer 50 is rotated. Then, a chemical liquid (cleaning liquid) capable of removing only the semiconductor film is made to flow onto the backside of the wafer 50 from the upper side of the wafer 50 so that the chemical liquid flow around to the peripheral portion of the face side of the wafer 50, whereby the semiconductor film 4 on the backside of the wafer 50 and the damaged portion 6 of the semiconductor film 4 at the peripheral end portion of the wafer 50 are removed. Thus, the remaining semiconductor film can be cleanly removed, and, as a result, sources of dusting can be eliminated.

The amount 16 of the chemical liquid flowing around to the face side of the wafer 50 can be controlled by the rotational frequency of the wafer 50 and the flow rate of nitrogen gas blown to the face side of the wafer 50 upwards from a ring-shaped blow-off port 40. Specifically, as shown in FIG. 3, the wafer 50 is disposed with its backside 7 up, the wafer 50 is rotated as indicated by arrow 8, and, in this condition, the cleaning liquid (the chemical liquid) 9 capable of removing only the semiconductor film is supplied from the upper side, while the nitrogen gas 10 is supplied from the lower side, and the nitrogen gas for controlling the flowing-around of the cleaning liquid is blown onto the face side of the wafer 50 from the ring-shaped blow-off port 40 formed in a stage 12. In this case, the wafer 50 is held by a chuck 11 so that the lower surface (the face side) of the wafer 50 is spaced from the surface of the stage 12, and the cleaning liquid 13 flowing around from the backside 7 of the wafer 50 cleans the peripheral portion 15 of the surface 14 of the wafer 50. Besides, the amount 16 of the cleaning liquid 13 flowing around to the lower surface (the face side) 14 of the wafer 50 is shown in FIG. 3.

The chemical liquid (cleaning liquid) 13 for removing the semiconductor film 4 on the backside and at the damaged portion 6 at the peripheral end portion of the wafer 50 varies depending on the combination of the kind of the semiconductor film 4 to be removed and the kind of the insulating film 3 formed beneath the semiconductor film 4. Preferably, the ratio of rates of etching of the semiconductor film 4 and the insulating film 3 by the chemical liquid is not less than 100. For example, where the semiconductor film 4 is a polysilicon film and the insulating film 3 is a $Si_3N_4$ film or a $SiO_2$ film, fluoronitric acid (a mixed liquid of HF and $HNO_3$) may be used. Where the semiconductor film 4 is a $SiO_2$ film and the insulating film 3 is a $Si_3N_4$ film, hydrofluoric acid may be used.

Figure 4A:
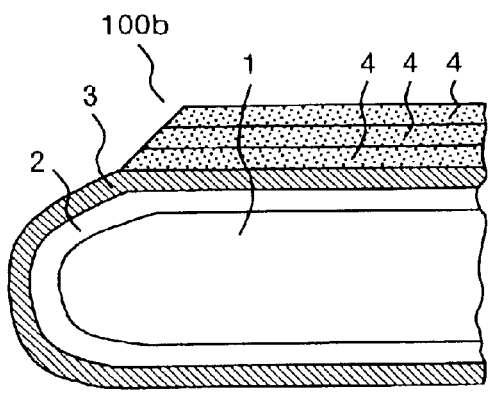
FIGS. 4A to 4D are conceptual views showing a sectional peripheral portion of the semiconductor apparatus according to another embodiment, different from the semiconductor apparatus shown in FIG. 1, of the present invention.
Figure 4B:
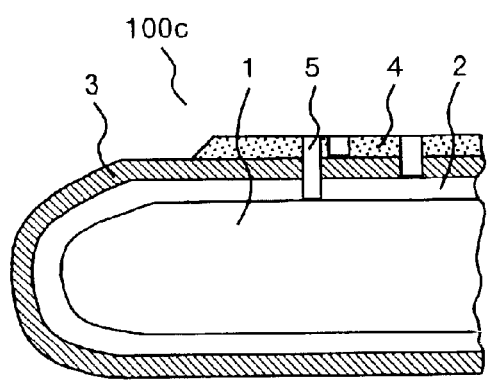

FIG. 1 shows one embodiment (100a) of the semiconductor apparatus according to the present invention. Another embodiment of the semiconductor apparatus according to the present invention, as shown in FIG. 4A, is a semiconductor apparatus 100b comprising multilayered semiconductor films 4. A further embodiment, as shown in FIG. 4B, may be a semiconductor apparatus 100c in which the semiconductor film 4 is removed by causing the cleaning liquid 13 to flow around within such a range as not to exert bad influences on the semiconductor device 5 formed on the semiconductor substrate 1.

Figure 4C:
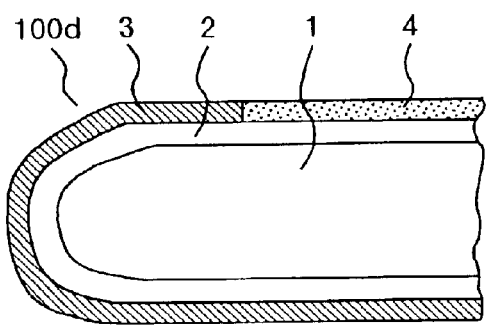
Figure 4D:
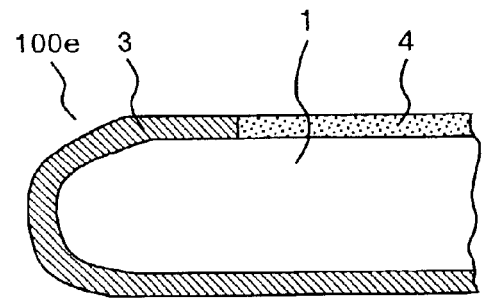

Other embodiments of the semiconductor apparatus according to the present invention could conceivably be semiconductor apparatuses 100d and 100e, as shown in FIGS. 4C and 4D, respectively, which are produced by a method in which the semiconductor film 4 is formed directly on the insulating film 3 having been formed in the range from the peripheral portion to the backside of the wafer and been patterned as to the circuit formation region on the face side, then the surface is flattened by a CMP method, and the semiconductor film remaining at the peripheral portion and on the backside is removed by the above-mentioned cleaning method. It is desirable that the underlying film is entirely covered by use of the insulating film 3 on the backside of the semiconductor substrate 1 where the semiconductor device 5 is not formed. Here, the underlying film is the underlying film 2 formed of a semiconductor film material such as a $SiO_2$ film or an insulating film material such as a $Si_3N_4$ film in the cases of FIGS. 4A to 4C, and is the Si substrate 1 in the case of FIG. 4D.

Figure 5A:
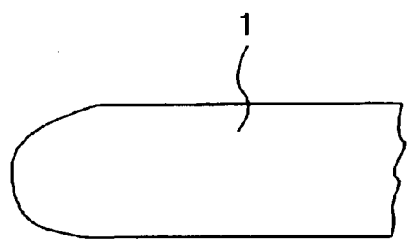
FIGS. 5A to 5F show the production process of the semiconductor apparatus shown in FIG. 4D.
Figure 5D:
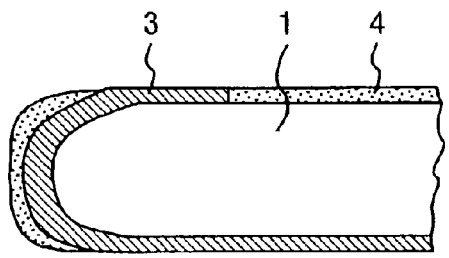
Figure 5B:
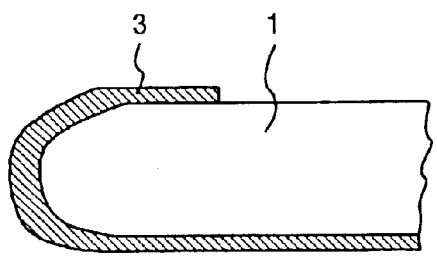

Next, production processes of the semiconductor apparatus 100d and 10e shown in FIGS. 4C and 4D respectively will be described referring to FIGS. 5A to 5F. First, in FIG. 5A, a peripheral end portion of a Si substrate is shown in cross section. Next, as shown in FIG. 5B, an insulating film 3 is formed on the Si substrate 1, and a pattern of the insulating film 3 is formed through such steps of photoresist application, light exposure, dry etching and photoresist removal which are commonly well known. Incidentally, the insulating film 3 may be multilayered, and a circuit pattern or patterns may be present or absent. Then, as shown in FIG. 5C, a semiconductor film 4 is formed on the insulating film 3. Subsequently, as shown in FIG. 5D, the semiconductor film 4 is flattened by a CMP (Chemical Mechanical Polishing) step. In this instance, the semiconductor film 4 is left on a peripheral portion of the insulating film 3.

Figure 5E:
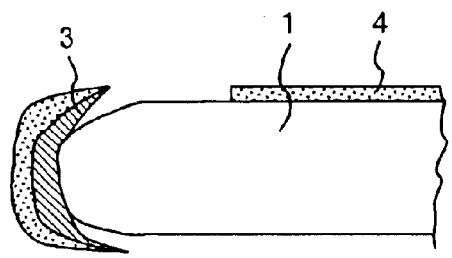
Figure 5C:
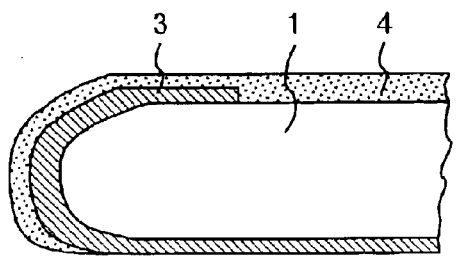

Next, in the case where the rate of etching of the semiconductor film 4 by an etching liquid is slow when removal of the insulating film 3 by the etching liquid is conducted, as shown in FIG. 5E, the semiconductor film 4 is left at the peripheral end portion, and, further, the insulating film 3 present beneath the semiconductor film 4 is left in the form of eaves to form sources of dusting.

Figure 5F:
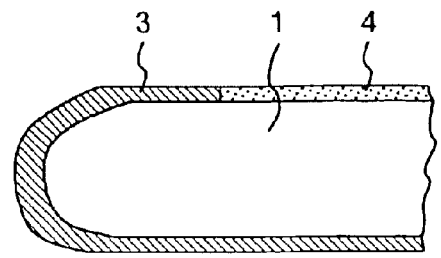

In view of this, after FIG. 5D, as has been described above, the semiconductor film 4 remaining on the peripheral portion of the insulating film 3 is removed by cleaning by use of the cleaning apparatus shown in FIG. 3, for example. Thus, as shown in FIG. 5F, the semiconductor film 4 is made to be absent on the peripheral portion of the insulating film 3, with the result that the sources of dusting can be eliminated.

In this case, also, the chemical liquid for removing the semiconductor film 4 from the backside of the wafer 50 and from the damaged portion at the peripheral portion of the wafer 50 varies depending on the combination of the kind of the semiconductor film 4 to be removed and the kind of the insulating film 3 present beneath the semiconductor film 4. However, preferably, the ratio of rates of etching of the semiconductor film 4 and the insulating film 3 by the chemical liquid is not less than 100. For example, where the semiconductor film 4 is a polysilicon film and the insulating film 3 is a $Si_3N_4$ film or a $SiO_2$ film, fluoronitric acid (a mixed liquid of HF and $HNO_3$) may be used. On the other hand, where the semiconductor film 4 is a $SiO_2$ film and the insulating film 3 is a $Si_3N_4$ film, hydrofluoric acid may be used.

Now, an example in which a Bi-CMOS structure according to the present invention is applied to a dynamic RAM will be described below.

EXAMPLE 1

Figure 6A:
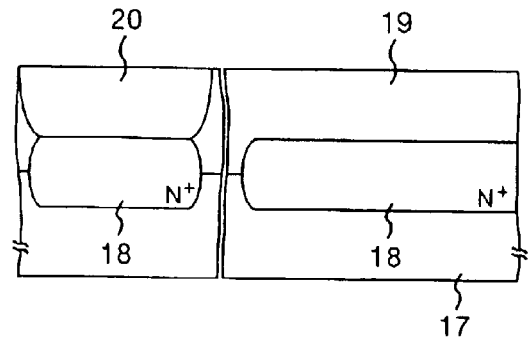
FIGS. 6A to 6D are detailed sectional views showing the production process up to the step of forming a capacitor device in a trench in the case of a dynamic RAM comprising a Bi-CMOS structure as a semiconductor apparatus.

FIGS. 6A to 6D are step diagrams showing a process for producing a semiconductor apparatus according to the present invention. First, as shown in FIG. 6A, for example, Sb is diffused into a plurality of desired regions of a P-type silicon semiconductor substrate 17 to form $N^+$ buried layers 18 having an impurity concentration of about $5 \times 10^{18}$ to $10^{20}$ $cm^{-3}$. Next, a P-type silicon epitaxial layer 19 having an impurity concentration of about $5 \times 10^{15}$ to $5 \times 10^{17}$ $cm^{-3}$ is grown in a thickness of about 3 to 10 $\mu$m on the entire surface of the wafer. Then, in the desired regions, N well regions 20 having the same level of concentration as the P-type epitaxial layer 19 and having such a depth (about 2 to 9 $\mu$m) as to reach the $N^+$ buried layer 18 are formed. These components 17, 18, 19 and 20 correspond to the semiconductor substrate (for example, Si substrate) 1 in the present invention.

Figure 6B:
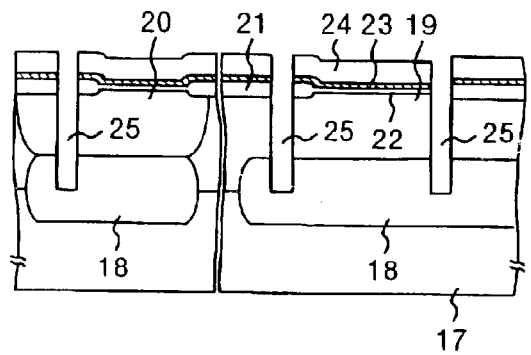

Next, as shown in FIG. 6B, a device isolation oxide film 21 having a thickness of about 300 nm is formed on the surface of the epitaxial layer 19 by use of, for example, a known thermal oxide film forming method. Then, an oxide film 22 having a thickness of about 50 nm, a $Si_3N_4$ film 23 having a thickness of about 100 nm, and a $SiO_2$ film 24 having a thickness of about 600 nm are sequentially formed on the epitaxial layer 19 by use of, for example, a CVD method or the like. Here, the $Si_3N_4$ film 23 is so formed as to range around to the entire surface on the backside of the wafer. The method for forming the $Si_3N_4$ film is not particularly limited. For example, a batch-type low-pressure CVD method may be adopted.

With these laminated insulating films used as a mask, a plurality of trenches 25 reaching the buried layer 18 are formed. The depth of the trenches 25 is such that the bottoms of the trenches 25 reach the buried layer 18; for example, the depth is about 3 to 10 μm.

Figure 6C:
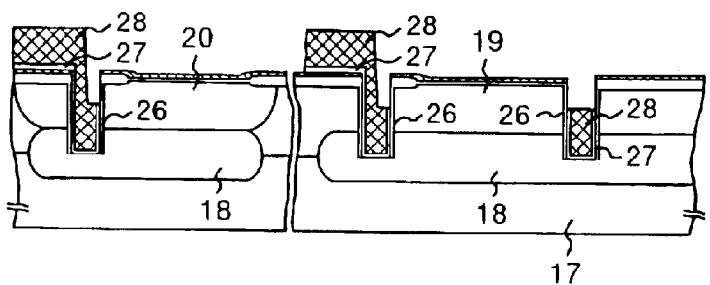

Subsequently, as shown in FIG. 6C, selective oxidation is conducted by use of the $SiO_2$ film 24 and the $Si_3N_4$ film 23 as a mask to thereby form an oxide film ($SiO_2$) 26 having a thickness of about 50 nm only in the trenches 25, thereafter the oxide film 26 only on the bottom surfaces of the trenches 25 is removed by anisotropic etching (RIE), and, simultaneously, the $SiO_2$ film 24 is also etched away.

Next, an N-type polysilicon film 27 having a thickness of about 50 nm is built up on the entire surface of the wafer. In this instance, the polysilicon film 27 is in contact with the buried layers 18.

Thereafter, with a patterned photoresist 28 used as a mask, the polysilicon film 27 is patterned by isotropic etching or the like. The remaining polysilicon film 27 is present in the trenches 25, and, further, the polysilicon film 27 in the trenches other than the trenches which are utilized as capacitors extends locally to the upper side of the device isolation oxide film 21 so as to be taken out as plate electrodes for applying a plate potential (½ Vcc). These components 21 to 27 correspond to the underlying film 2 in the present invention. Incidentally, the polysilicon film 27 is a semiconductor film material.

Figure 6D:
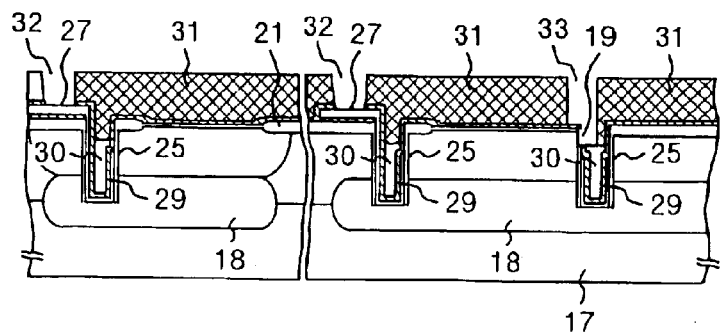

Subsequently, after the removal of the photoresist, as shown in FIG. 6D, a capacitor insulating film 29 is built up on the entire surface of the face side, the peripheral end portion and the backside of the wafer. As the capacitor insulating film 29, for example, a $SiO_2/Si_3N_4$ layered film having a film thickness reduced to oxide film of 3 to 5 nm is used. Here, of the capacitor insulating film 29, the $Si_3N_4$ film is not only formed on the face side of the wafer but also so formed as to range around through the peripheral portion inclusive of the peripheral end portion of the wafer to the backside of the wafer so that the P-type silicon semiconductor substrate 17 constituting the semiconductor substrate 1 is not exposed. The method for forming the $Si_3N_4$ film is not particularly limited. For example, a batch-type low-pressure CVD method is adopted. Thus, the $Si_3N_4$ film in the capacitor insulating film 29 corresponds to the insulating, film 3 in the present invention.

Next, an N-type polysilicon film 30 corresponding to the semiconductor film 4 in the present invention is built up on the insulating film 29, including the areas on the peripheral portion and the backside of the wafer, in such a thickness as to fill up the trenches 25 by, for example, a CVD method. Then, the N-type polysilicon film 30 is etched by isotropic etching, to leave the N-type polysilicon film 30 only in the trenches 25. Subsequently, a photoresist 31 is applied to the wafer, the capacitor insulating film 29 in predetermined regions is removed by use of the photoresist 31 as a mask, further, the oxide film 26, if present, is also removed, and contact holes 32 and 33 are made.

Then, in the contact hole 32, the polysilicon film 27 extending onto the device isolation oxide film 21 is exposed because the insulating film 29 has been removed. In the contact hole 33, since further the oxide film 26 has been partially removed, the epitaxial layer 19 at the partially removed portions and the polysilicon film 30 are exposed.

Subsequently, the photoresist 31 shown in FIG. 6D is removed, and thereafter an etching cleaning treatment of the wafer is conducted by use of fluoronitric acid (a mixed liquid of HF and $HNO_3$) as a chemical liquid by the cleaning method shown in FIG. 3, for example. Specifically, by using Model RST100, a product by SEZ, shown in FIG. 3 as the cleaning apparatus and fluoronitric acid as the chemical liquid, the polysilicon film 30 in the region of about 2 mm from the outer circumferential portion of the wafer is removed while preventing the chemical liquid from coming into contact with an integrated circuit pattern region 35 for formation of the semiconductor device shown in FIG. 8A.

As a result of observation, the polysilicon film 30 remaining at the peripheral portion inclusive of the peripheral end portion of the wafer was not observed. Incidentally, the composition ratio of HF and $HNO_3$ in the fluoronitric acid used was so adjusted that the ratio of etching rates of the capacitor insulating film 29 and the polysilicon film 30 was about 1:6000. In addition, the rotational frequency of the wafer was 50 to 300 rpm, the time of treatment with the chemical liquid was 30 sec, and the flow rate of nitrogen gas was 80 to 100 liter/min.

For example, as shown in FIG. 3, with the wafer disposed with its backside up and rotated, the chemical liquid 9 is supplied from the center on the upper side, while a ring-shaped nitrogen gas is blown onto the wafer from the ring-shaped blow-off port 40 formed in the stage 12 disposed on the lower side of the wafer. At this time, since the wafer is held by the chuck 11 with its face side spaced from the stage 12, the chemical liquid flowing around from the backside of the wafer cleans away the polysilicon film 30 present at the peripheral portion on the face side of the wafer. Incidentally, the amount of the chemical liquid flowing around can be controlled by controlling the rotational frequency of the wafer and the flow rate of nitrogen gas blown onto the wafer.

Figure 7:
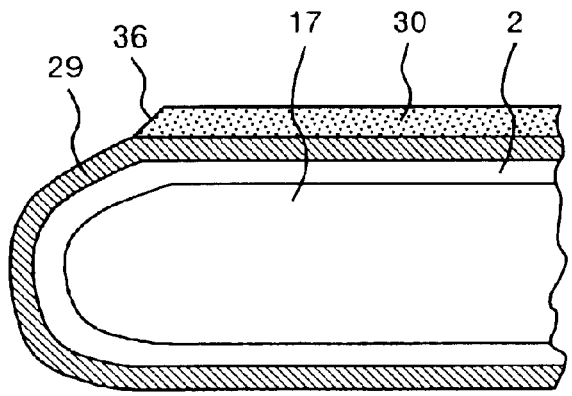
FIG. 7 is a conceptual view showing a sectional peripheral portion of a semiconductor apparatus in which a peripheral portion of a polysilicon film being a semiconductor film and the backside are subjected to etching cleaning, in Example 1 of the present invention.
Figure 8A:
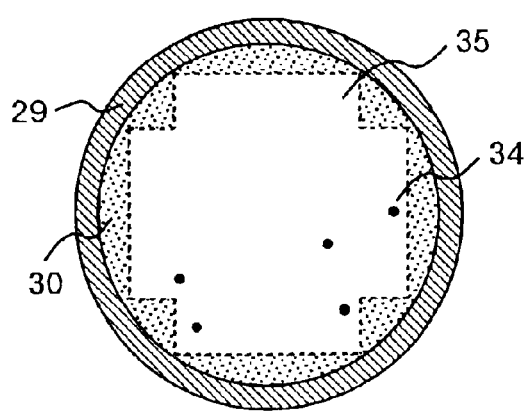
FIGS. 8A and 8B show an examined face side and an examined backside, respectively, including the condition of deposition of particles, of the semiconductor apparatus in which the peripheral portion of the polysilicon film being a semiconductor film and the backside are subjected to etching cleaning, in Example 1 of the present invention.
Figure 8B:
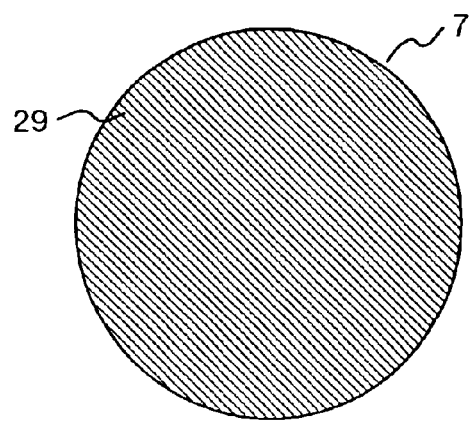

Meanwhile, the wafer having been cleaned with fluoronitric acid was cleaned with BHF (a mixed etching liquid of HF (hydrofluoric acid) and $NH_4F$ (ammonium fluoride)) by use of a batch-type cleaning tank, and the wafer was inspected for particles on an appearance inspection apparatus IS-2500, a product by Hitachi, Ltd. As shown in FIG. 8A, it was found that the number of particles left on the wafer could be reduced to about 50 pieces/wafer. Here, when observing the cleaned wafer from the upper side, only the capacitor insulating film 29 was observed at the peripheral end portion of the wafer, and the remaining polysilicon film 30 was observed on the inside thereof. That is, the remaining polysilicon film 30 was not observed at the peripheral end portion of the wafer. In addition, as shown in FIG. 8B, the polysilicon film on the backside of the wafer had been removed, and only the capacitor insulating film 29 was observed on the backside. Further, the etched and cleaned section of the polysilicon film 30 had a slope 36 as shown in FIG. 7.

Thus, a semiconductor apparatus is obtained in which a capacitance device comprising the capacitor insulating film 29 sandwiched between the N-type polysilicon film 27 and the N-type polysilicon film 30 is formed in the trench 25 of the wafer.

Next (after the cleaning treatment), an N-type polysilicon film (not shown) is further deposited on the polysilicon film 30. Subsequently, an impurity is diffused into the exposed epitaxial layer 19 through the portion of the contact hole 33 by, for example, a phosphorus diffusion method to form an $N^-$-type diffusion layer with a concentration of about $10^{18}$ cm$^{-3}$ at side wall portions in the vicinity of the inlet of the trench 25. Next, the polysilicon film built up is patterned into a predetermined shape. This is enveloped with an oxide film through selective oxidation by thermal oxidation or the like using the Si$_3$N$_4$ film 23 as a mask, for example. Thereafter, the oxide film 29, the Si$_3$N$_4$ film 23 and the SiO$_2$ film 24 which are exposed are etched away. Subsequently, a gate insulating film is formed at the portion of the wafer for formation of a gate electrode, and an N-type polysilicon film deposited thereon is patterned to form the gate electrode.

Subsequently, a pair of N$^-$-type diffusion layers are formed in the epitaxial layer 19 so as to sandwich the gate electrode therebetween, and, further, an LDD spacer is formed at a side portion of the gate electrode. Then, the N$^-$-type diffusion layer formed previously comes in contact with one of the pair of N$^-$-type diffusion layers to constitute a part of a drain electrode. Besides, the other of the pair of N$^-$-type diffusion layers constitutes a source electrode. In this manner, an MOS transistor connected to the capacitor device is formed. Incidentally, the cell constituted of the MOS transistor and the capacitor device is formed repeatedly in one wafer.

Then, an N$^+$-type diffusion layer with an impurity concentration of about 10$^{20}$ cm$^{-3}$ is formed in the region of the N well 20, and a P$^-$-type diffusion layer with an impurity concentration of about 10$^{18}$ cm$^{-3}$ is formed so as to surround the N$^+$-type diffusion layer. These diffusion layers formed in the region of the N well constitute emitter and base electrodes of a bipolar transistor.

Next, an interlayer insulating film is deposited on the face side of the wafer, bit wiring is formed in the interlayer insulating film, and it is connected to the source electrode through the contact hole. Besides, the collector, emitter and base electrodes of the bipolar transistor and the plate electrode of the capacitor device are taken out through metallic wiring formed in the interlayer insulating film, whereby a dynamic RAM comprising a Bi-CMOS structure is completed.

EXAMPLE 2

Now, a process for producing a semiconductor apparatus according to Example 2 of the present invention will be described below referring to FIGS. 6A to 6D. Example 2 differs from Example 1 in that the following step is added between the step shown in FIG. 6B and the step shown in FIG. 6C.

More specifically, in Example 2, a SiO$_2$ film (semiconductor film) 24 is formed, a plurality of trenches 25 are formed, and thereafter the SiO$_2$ film is flattened by use of a well known CMP method (chemical mechanical polishing). Incidentally, the CMP method is described, for example, in Japanese Patent Laid-open No. Hei 9-22885. Next, by using Model RST100, a product by SEZ, shown in FIG. 3 as a cleaning apparatus and using hydrofluoric acid (concentration: 50%) as a chemical liquid, the SiO$_2$ film (semiconductor film) 24 in the range of about 2 mm from the outer circumferential end of the wafer is removed while preventing the chemical liquid from making contact with an integrated circuit pattern region 35 for formation of a semiconductor device shown in FIG. 9A. As a result of observation, the SiO$_2$ film 24 remaining on the peripheral portion inclusive of the peripheral end portion of the wafer was not observed. Here, the rotational frequency of the wafer was 50 to 300 rpm, the time of treatment with the chemical liquid was 20 sec, and the flow rate of nitrogen gas was 80 to 100 liter/min.

Figure 9A:
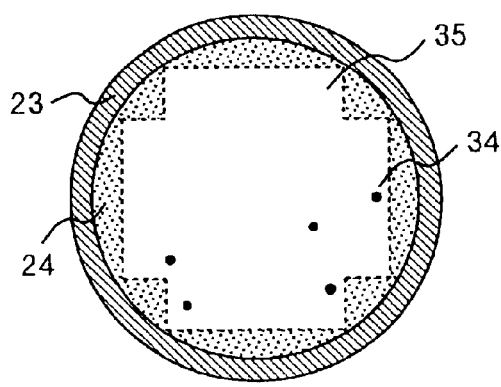
FIGS. 9A and 9B show an examined face side and an examined backside, respectively, including the condition of deposition of particles, of a semiconductor apparatus in which a peripheral portion of a polysilicon film being a semiconductor film and the backside are subjected to etching cleaning, in Example 2 of the present invention.
Figure 9B:
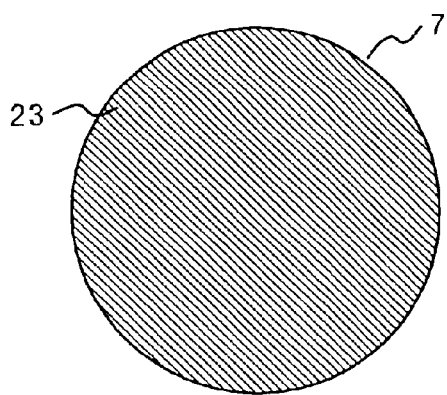

Further, when observing the wafer from the upper side, as shown in FIG. 9A, a Si$_3$N$_4$ film (insulating film) 23 was observed at the outer periphery, and the SiO$_2$ film (semiconductor film) 24 left without being removed was observed on the inside thereof. In addition, as shown in FIG. 9B, the SiO$_2$ film 24 on the backside of the wafer had been completely removed, and the Si$_3$N$_4$ film 23 as an underlying film was observed. Besides, the section having undergone the cleaning treatment of the SiO$_2$ film 24 shown in FIG. 9A has a sloped shape as shown in FIG. 7.

Thereafter, the same steps as in Example 1 were conducted, whereby the semiconductor apparatus was completed. The particles generated during the cleaning treatment step in Example 2 showed the same degree of reduction as in Example 1 as shown in FIG. 9A.

Next, the effects of Examples 1 and 2 will be described.

Figure 10A:
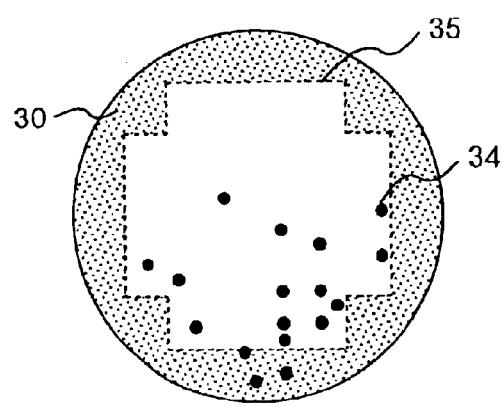
FIGS. 10A and 10B show an examined face side and an examined backside, respectively, including the condition of deposition of foreign matter, of a wafer according to Comparative Example 1.
Figure 10B:
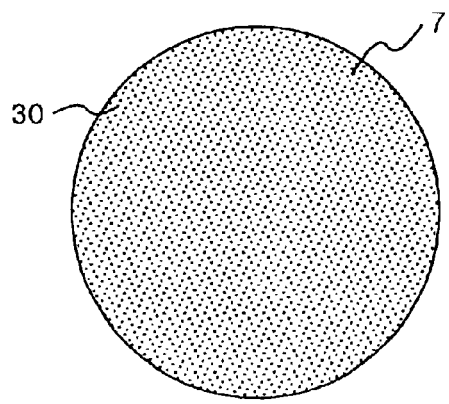

First, Comparative Example 1 will be described referring to FIG. 10. In Comparative Example 1, the etching cleaning in Example 1 was not conducted, the photoresist 31 shown in FIG. 6D was removed, and then the wafer was cleaned with BHF (a mixed etching liquid of HF and HN$_4$F) in a batch-type cleaning tank. In Comparative Example 1, when inspecting the wafer for particles thereon by use of an appearance inspection apparatus IS-2500, a product by Hitachi, Ltd., particles 34 in a number of 500 pieces/wafer were observed, as shown in FIG. 10A. Moreover, the polysilicon film 30 was observed on the peripheral end portion and the backside of the wafer, as shown in FIG. 10B.

Figure 11:
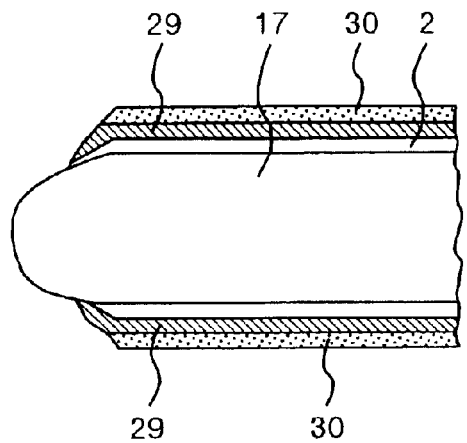
FIG. 11 shows a sectional peripheral portion of a wafer produced in Comparative Example 2.
Figure 12A:
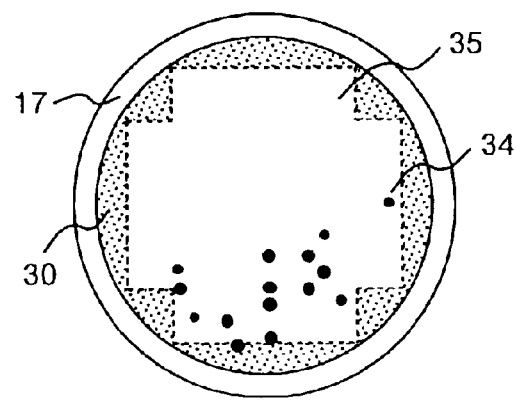
FIGS. 12A and 12B show an examined face side and an examined backside, respectively, including the condition of deposition of foreign matter, of the wafer produced in Comparative Example 2.
Figure 12B:
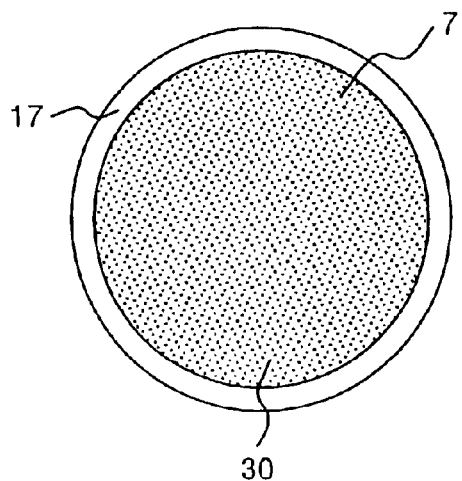

Next, Comparative Example 2 will be described. In Comparative Example 2, an experiment was conducted by use of the polishing method described in Japanese Patent Laid-open No. Hei 11-188590. In this experiment, polishing was conducted while varying the angle to the side surface of the wafer. As shown in FIG. 11, the underlying film 2 and the polysilicon film 30 on the backside were left, and, further, the capacitor insulating film 29 at the peripheral end portion was polished, with the result that the semiconductor substrate 17 was exposed. Thereafter, the wafer was cleaned with BHF, and the appearance of the wafer was inspected, upon which the number of particles remaining on the wafer was found to be about 100 to 200 pieces/wafer. In addition, as a result of the observation, it was found that, as shown in FIGS. 12A and 12B, the Si substrate 17 was exposed at a peripheral portion on the face side of the wafer, the Si substrate 17 was exposed also at a peripheral portion on the backside of the wafer, and the polysilicon film 30 was left unpolished on the inside thereof.

Figure 13:
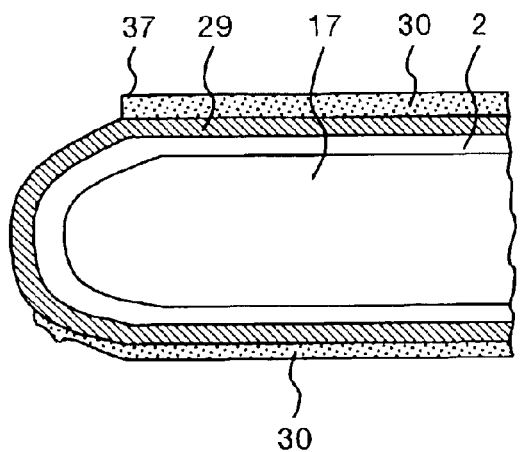
FIG. 13 shows a sectional peripheral portion of a wafer produced in Comparative Example 3.
Figure 14A:
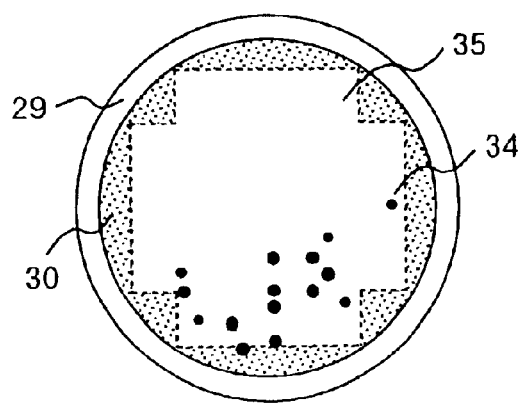
FIGS. 14A and 14B show an examined face side and an examined backside, respectively, including the condition of deposition of foreign matter, of the wafer produced in Comparative Example 3.
Figure 14B:
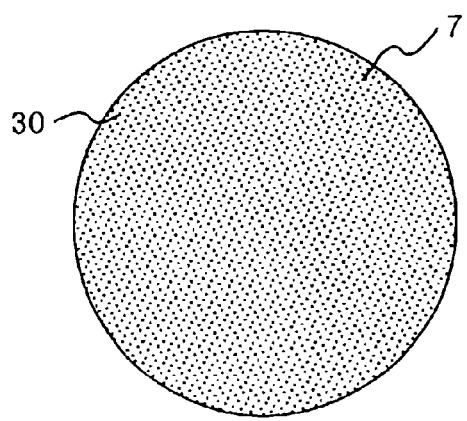

Next, Comparative Example 3 will be described. In Comparative Example 3, removal of the polysilicon film was conducted by use of the dry etching method described in Japanese Patent Laid-open No. Hei 5-21724. In the case of Comparative Example 3, the polysilicon film 30 was observed remaining on part of the peripheral portion and on the backside of the wafer. In addition, as for the polysilicon film on the wafer, the dry-etched surface 37 of the polysilicon film 30 did not have a sloped shape, as shown in FIG. 13. Thereafter, the wafer was cleaned with BHF, and the appearance of the wafer was inspected, upon which the number of particles remaining on the wafer was found to be about 100 to 200 pieces/wafer. In addition, as a result of the observation, as shown in FIGS. 14A and 14B, it was found that the insulating film 29 was exposed at a peripheral portion on the face side of the wafer, and the polysilicon film 30 was exposed on the entire surface on the backside 7 of the wafer.

As has been described above, according to Example 1 of the present invention, as shown in FIG. 7, the generation of particles can be clearly decreased as compared with Comparative Examples 1 to 3, and it is possible to remove only the polysilicon film 30 present on the backside of the wafer. That is, by use of the method described in Example 1, the number of particles generated during the process for producing the semiconductor apparatus shown in FIG. 6 can be reduced, and, as a result, it is possible to reduce the fraction defective of the semiconductor product.

Incidentally, it is natural that the foregoing is not limited to the production of the semiconductor apparatus but is applicable to thin-film devices, disks and the like which have the same apparatus structure or production process as above.

According to the present invention, it is possible to effectively decrease the generation of chippings and dusting due to film exfoliation at the peripheral end portion of a semiconductor apparatus, and, as a result, it is possible to produce the semiconductor apparatus at low cost and in a high yield.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications as fall within the ambit of the appended claims.

We claim:

1. A method of producing a semiconductor device, comprising:

an insulating film forming step for forming an insulating film on at least the backside and a peripheral portion inclusive of a peripheral end portion of a semiconductor substrate;

a semiconductor film forming step for forming a semiconductor film on said insulating film, formed in said insulating film forming step, over both the backside and the peripheral end portion of the substrate and in a face side region of the substrate exclusive of said peripheral portion; and a removing step for removing said semiconductor film formed in said semiconductor film forming step at least from the insulating film formed on the backside and said peripheral end portion of the substrate at a high etching rate relative to said insulating film beneath said semiconductor film.

2. A method of producing a semiconductor device as set forth in claim 1, further comprising a device forming step for forming a plurality of semiconductor devices by processing at least said semiconductor film in said face side region, after said removing step.

3. A method of producing a semiconductor device as set forth in claim 1, wherein said removing step is performed by use of a chemical liquid.

4. A method of producing a semiconductor device as set forth in claim 1, wherein said removing step is performed such that with a wafer disposed with its backside up and rotated, a ring-shaped nitrogen gas is blown onto said wafer from the lower side, and a chemical liquid is supplied to a central portion of said backside of said wafer so as to flow on said backside of said wafer and flow around to a peripheral portion of the face side of said wafer.

5. A method of producing a semiconductor device as set forth in claim 3, wherein said chemical liquid is a chemical liquid selected from the group consisting of acidic solutions containing at least one of hydrofluoric acid, nitric acid, acetic acid and organic acids, acidic mixed solutions containing aqueous hydrogen peroxide and ammonium fluoride in said acidic solution, and neutral solutions such as water.

6. A method of producing a semiconductor device comprising:

an insulating film forming step for forming an insulating film on at least a backside (rear) surface and a peripheral portion inclusive of a peripheral end portion of a semiconductor substrate;

a semiconductor film depositing step for depositing a semiconductor film on said backside (rear) portion and said peripheral portion of said insulating film formed in said insulating film forming step and in a face side (front) region exclusive of said peripheral portion; and a removing step for removing said semiconductor film from said insulating film formed over said backside portion and from said peripheral end portion of the substrate, exclusive of said face side region for forming a plurality of semiconductor devices, by wet etching using a chemical liquid at a high etching selective rate relative to said insulating film beneath said semiconductor film.

7. A method of producing a semiconductor device as set forth in claim 6, further comprising a device forming step for forming a plurality of semiconductor devices by processing at least said semiconductor film in said face side region, after said removing step.

8. A method of producing a semiconductor device as set forth in claim 6, wherein said removing step is performed such that with a wafer disposed with its backside up and rotated, a ring-shaped nitrogen gas is blown onto said wafer from the lower side, end a chemical liquid is supplied to a central portion of said backside of said wafer so as to flow on said backside of said wafer and flow around to a peripheral portion of the face side of said wafer.

9. A method of producing a semiconductor device as set forth in claim 3, wherein said chemical liquid is a chemical liquid selected from the group consisting of acidic solutions containing at least one of hydrofluoric acid, nitric acid, acetic acid and organic acids, acidic mixed solutions containing aqueous hydrogen peroxide and ammonium fluoride in said acidic solution, and neutral solutions such as water.

10. A method of producing a semiconductor device as set forth in claim 1, wherein said insulating film forming step includes a step for forming the insulating film on an entire surface including said face side surface, backside surface and peripheral portion of the semiconductor substrate.

11. A method of producing a semiconductor device as set forth in claim 10, wherein said semiconductor film depositing step includes a step for depositing the semiconductor film on an entire surface of said insulating film.

12. A method of producing a semiconductor device as set forth in claim 6, wherein said insulating film forming step includes a step for forming the insulating film on an entire surface including said face side surface, backside surface and peripheral portion of the semiconductor substrate.

13. A method of producing a semiconductor device as set forth in claim 12, wherein said semiconductor film depositing step includes a step for depositing the semiconductor film on an entire surface of said insulating film.

14. A method of producing a semiconductor device as set forth in claim 1, wherein said etching rate is such that said semiconductor film is etched away from the insulating film formed on the backside and peripheral end portion of the substrate without any substantial etching of the insulating film.

15. A method of producing a semiconductor device as set forth in claim 14, wherein a ratio for said etching rate between said insulating film and said semiconductor film is 1:100 or less.

16. A method of producing a semiconductor device as set forth in claim 15, wherein said ratio is 1:6000.

17. A method of producing a semiconductor device as set forth in claim 6, wherein said etching rate is such that said semiconductor film is etched away from the insulating film formed on the backside and peripheral end portion of the substrate without any substantial etching of the insulating film.

18. A method of producing a semiconductor device as set forth in claim 17, wherein a ratio for said etching rate between said insulating film and said semiconductor film is 1:100 or less.

19. A method of producing a semiconductor device as set forth in claim 18, wherein said ratio is 1:8000.

20. A method of producing a semiconductor device as set forth in claim 1, wherein said semiconductor film is formed by a CVD method.

21. A method of producing a semiconductor device as set forth in claim 6, wherein said semiconductor film is deposited by a CVD method.

* * * * *